United States Patent

Bosco et al.

[11] Patent Number: 5,917,316
[45] Date of Patent: Jun. 29, 1999

[54] MEASURING DEVICE FOR A METAL-ENCLOSED, GAS-INSULATED HIGH-VOLTAGE INSTALLATION

[75] Inventors: Antonio Bosco, Wikon, Switzerland; Thomas Hertig, Greensburg, Pa.; Andrzej Kaczkowski, Würenlingen, Switzerland

[73] Assignee: Asea Brown Boveri AG, Baden, Switzerland

[21] Appl. No.: 08/889,573

[22] Filed: Jul. 8, 1997

[30] Foreign Application Priority Data

Aug. 23, 1996 [DE] Germany .......................... 196 34 236

[51] Int. Cl.⁶ .................................................. G01R 15/04
[52] U.S. Cl. .......................... 324/126; 324/127; 324/536; 336/175
[58] Field of Search .................................. 336/174, 175; 324/126, 127, 536

[56] References Cited

U.S. PATENT DOCUMENTS

| 3,869,665 | 3/1975 | Kenmochi .............................. 324/536 |
| 4,354,154 | 10/1982 | Schiemann . |

FOREIGN PATENT DOCUMENTS

| 0510311A2 | 10/1992 | European Pat. Off. . |
| 0522303A2 | 1/1993 | European Pat. Off. . |
| 0603857 | 6/1994 | European Pat. Off. . |
| 0652441A1 | 5/1995 | European Pat. Off. . |
| 1166359 | 3/1964 | Germany . |
| 1638548 | 8/1970 | Germany . |
| 2814115 | 9/1979 | Germany . |
| 3544508A1 | 6/1987 | Germany . |
| 3712190A1 | 10/1988 | Germany . |
| 4101859C1 | 4/1992 | Germany . |
| 4210370A1 | 10/1993 | Germany . |
| 4429959A1 | 2/1996 | Germany . |

Primary Examiner—Josie Ballato
Assistant Examiner—Jose M. Solis
Attorney, Agent, or Firm—Burns, Doane, Swecker & Mathis, L.L.P.

[57] ABSTRACT

The measuring device is intended for a metal-enclosed, gas-insulated high-voltage installation. It contains at least one Rogovski coil (10), which is arranged in an enclosure tube (3), filled with insulating gas, of the metal enclosure and serves to detect the current in a current-carrying conductor (9), led through the enclosed tube (3), and a measuring electrode (11), which surrounds the conductor (9) and serves to detect the voltage of the conductor (9). The current conductor (9) is rigidly connected to a current-conducting cast armature (13) of an insulator (14) fastened to the enclosure tube (3). In the measuring device according to the invention, a defined field geometry is maintained in the interior of the enclosure tube (3) even over long periods and under changing loads. Consequently, the sensors, in particular the voltage sensor containing the measuring electrode (11), can transmit output signals of high measuring accuracy.

10 Claims, 4 Drawing Sheets

MEASURING DEVICE FOR A METAL-ENCLOSED, GAS-INSULATED HIGH-VOLTAGE INSTALLATION

BACKGROUND OF THE INVENTION

1. Field of the Invention

The invention proceeds from a measuring device for a metal-enclosed, gas-insulated high-voltage installation according to the preamble of patent claim 1. Such a measuring device contains at least one Rogovski coil, which is arranged in an enclosure tube, filled with insulating gas, of the metal enclosure and serves to measure the current in a conductor guided through the enclosure tube and subjected to a current. A measuring electrode embracing the conductor serves to measure the voltage of this conductor. Additional physical variables of the installation such as the pressure, the temperature and/or the density of the insulating gas, or the occurrence of partial discharges, can be measured by means of further sensors provided in the measuring device.

2. Discussion of Background

The invention refers here to a prior art of measuring devices for metal-enclosed, gas-insulated high-voltage installations such as is known, for example, from EP 0 510 311 A2. A combined current and voltage transformer, described in the prior art, for a metal-enclosed, gas-insulated high-voltage installation contains in the interior of an enclosure tube, filled with insulating gas, of the metal enclosure a Rogovski coil, which is guided around a current-carrying conductor and serves to measure the conductor current, and a tubular metal electrode, which is arranged concentrically with the conductor in an electrically insulating fashion and serves to measure the conductor voltage. Output signals transmitted by the Rogovski coil and the measuring electrode are led in shielded lines through the wall of the enclosure tube to an electronic evaluation system, which is situated remote from the metal enclosure and in which there are formed from the output signals measured values which correspond to the current led in the current conductor or to the voltage present on the current conductor.

SUMMARY OF THE INVENTION

Accordingly, one object of the invention as defined in patent claim 1 is to provide a novel measuring device for a metal-enclosed, gas-insulated high-voltage installation having sensors which are arranged in the enclosure tube of the metal enclosure and constructed as a Rogovski coil and measuring electrode and which are distinguished by a high measuring accuracy and a high operational reliability.

In the measuring device according to the invention, the current conductor is rigidly connected to an insulator which, for its part, is supported rigidly on the enclosure tube. Instead of the otherwise customary floating support of the current conductor on spring contacts, as well as by defined holding of conductor shields, it is thus possible to maintain a defined field geometry in the interior of the enclosure tube. This is of decisive importance for the accuracy of a voltage-proportional signal transmitted by the measuring electrode. The measured values transmitted by the measuring device can thus be used to perform various tasks such as control, measurement, protection and power metering. The large number of sensors previously required for this purpose can therefore be very substantially reduced.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
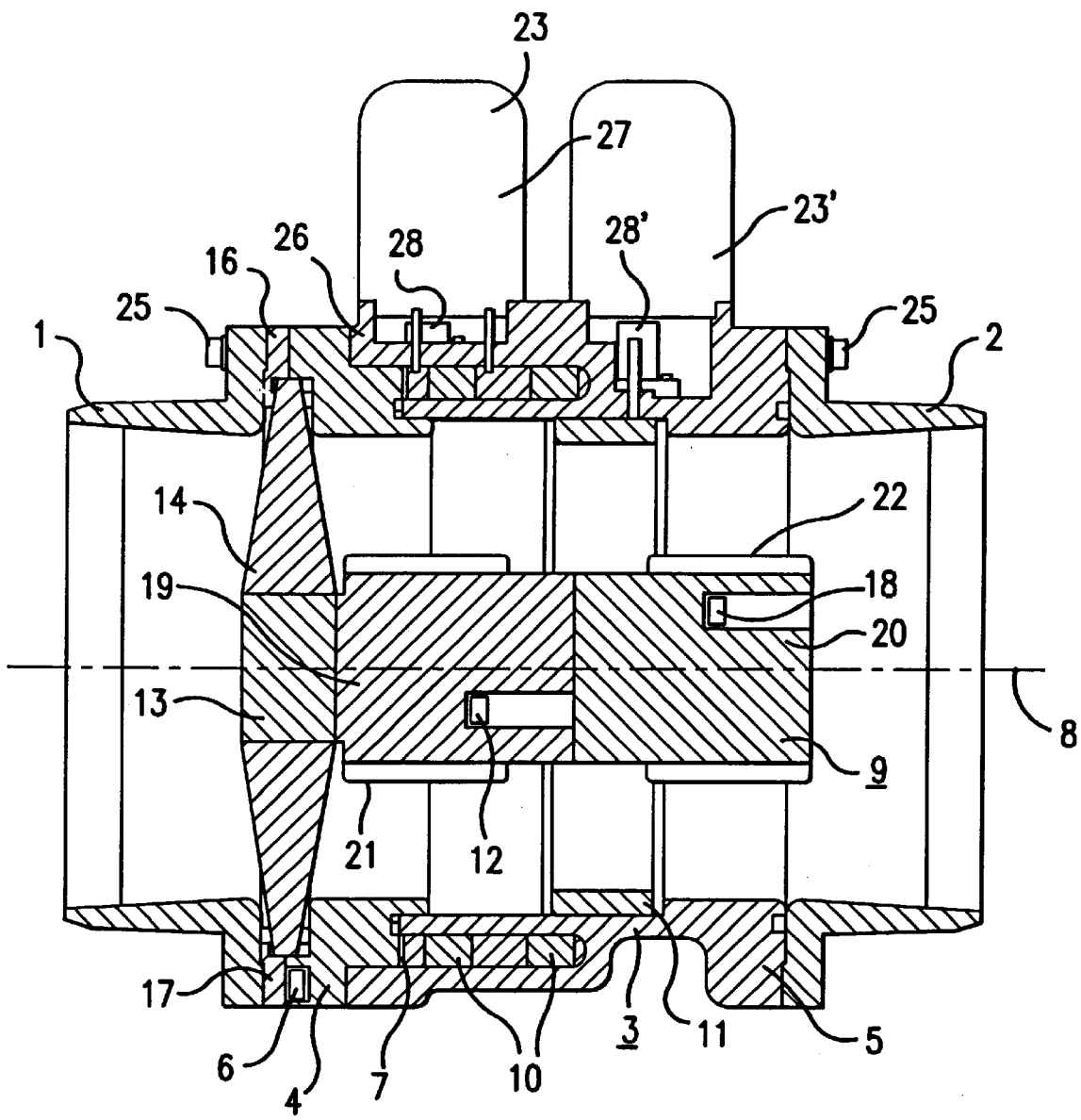
FIG. 1 shows, cut in the axial direction, a first embodiment of a measuring device according to the invention, having an enclosure tube and a current-carrying conductor arranged in the tube interior, as well as having sensors which are arranged in the tube interior and constructed as a Rogovski coil and insulated measuring electrode, and having a bipartite metal housing containing an electronic evaluation device.

Referring now to the drawings, wherein like reference numerals designate identical or corresponding parts throughout the several views, in FIG. 1 the measuring device represented has an enclosure tube 3 clamped between two flanges 1, 2 of a metal enclosure filled with an insulating gas such as, in particular, $SF_6$ at a pressure of up to a few bars. The enclosure tube 3 is formed by two metal tube sections 4, 5, which each have a flange and are clamped to one another in a gas-tight fashion by means of screws 6 and a sealing ring 7. A current conductor 9, which is essentially of cylindrical construction and at a high-voltage potential of typically several hundred kV is guided along the axis 8 of the enclosure tube 3. Located in a cavity bounded by the two tube sections 4, 5 are two Rogovski coils 10 which detect the current conducted in the current conductor 9. A metal measuring electrode 11 which is arranged in an electrically insulated fashion with respect to the enclosure tube 3 and detects the high voltage present on the current conductor 9 is attached to the inner surface,. facing the current conductor 9, of the enclosure tube in an annular groove bounded by the tube sections 4 and 5.

The current conductor 9 is rigidly connected with the aid of screws 12 to a cast armature 13, arranged on the axis 8, of an insulator 14. The screws 12 are guided in the direction of the axis 8 and are protected against unauthorized operation by a seal (sealing varnish). The annular outer rim of the insulator 14 is fixed on the flange of the tube section 4 with the aid of an axially guided holding ring 16. Screws 17 fixing the holding ring 16 on the tube section 4 are likewise protected against unauthorized operation by a seal.

The current conductor 9 is seen to be formed by two conductor sections 19, 20 which are rigidly connected to one another by axially guided screws 18. As a result, the screws 12 which fix the current conductor 9 on the insulator 14 can be relatively short. Like the screws 12 and 17, the screws 18 are protected against unauthorized operation by a seal. The corresponding statement also holds for further screws (not designated), which serve to fasten shields 21, 22 rigidly to the current conductor 9.

A defined field geometry can be maintained in the interior of the enclosure tube 3, owing to the rigid fastening of the current conductor 9 to the insulator 14, which is permanently connected to the enclosure tube 3, instead of the otherwise usual floating support of the current conductor 9 on spring contacts, as well as to the defined holding of the shield. This is of decisive importance for the accuracy of a voltage-proportional signal transmitted by the measuring electrode 11. Securing the screws 12, 17, 18 and the shields 21, 22 ensures that, after the part of the measuring device subjected to a high-voltage load has been produced, there is no change in its field geometry. The sensors contained in the measuring device, such as the Rogovski coils 10, the measuring electrode 11 and further sensors, which may be present, such as, for example, temperature, pressure and density sensors, partial-discharge sensors and arc monitors, can now be calibrated and the calibration values thereby determined, as well as further characteristics, such as compensation curves, which detect temperature-induced measurement errors, can be stored in a read-only data memory (for example a PROM) of an electronic evaluation device 23 of the measuring device which is arranged outside the interior, filled with insulating gas, of the enclosure tube 3. This data memory can likewise be protected against unauthorized operation by sealing, and is accessible only to the electronic system of the evaluation device 23. If the electronic system of the evaluation device 23 is defective, after it has been exchanged the electronic system newly inserted into the evaluation device can directly access the data stored in the PROM. Calibration work can therefore be dispensed with when exchanging the electronic system.

Figure 2:
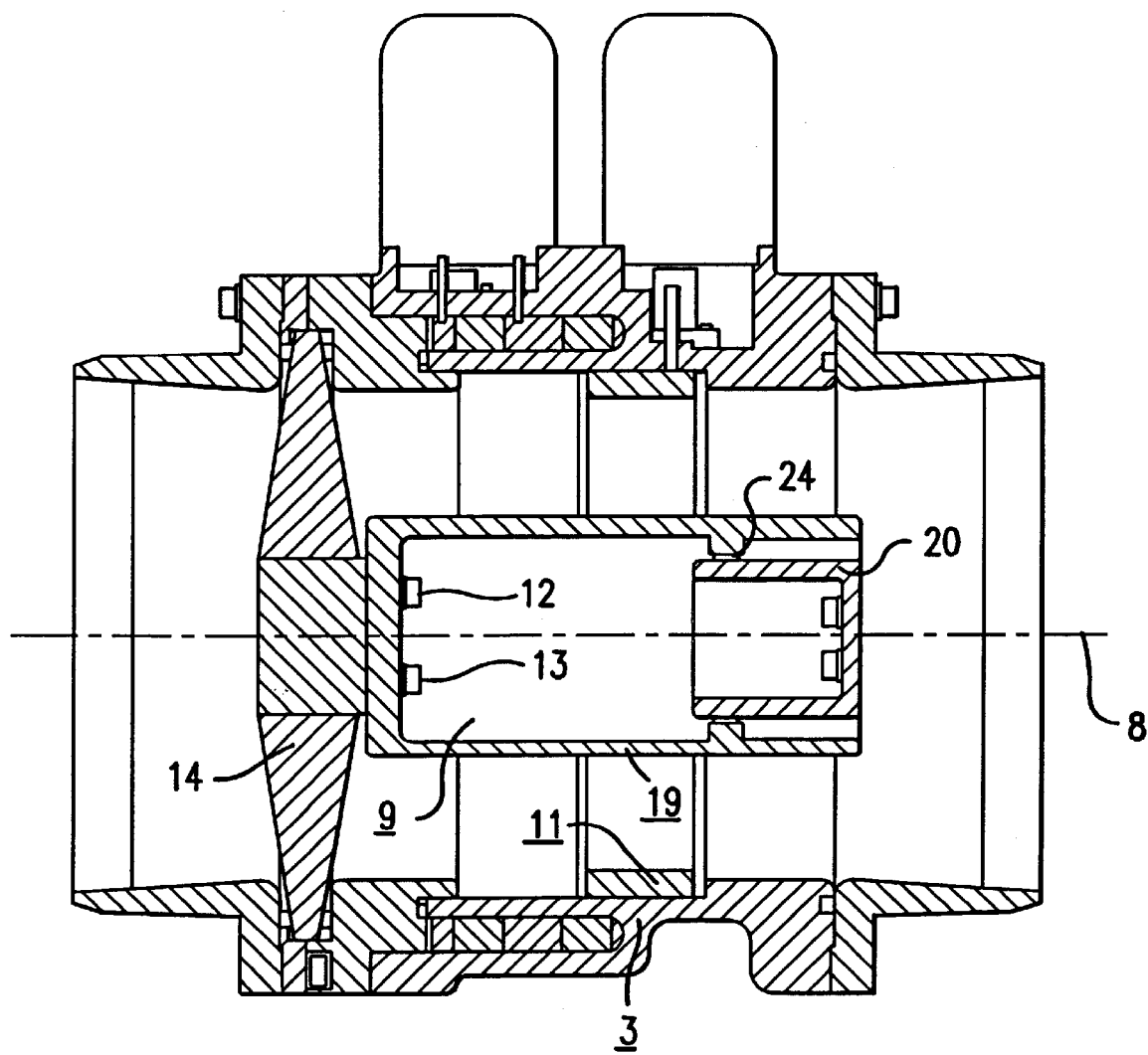
FIG. 2 shows, cut in the axial direction, a second embodiment of the measuring device according to the invention, which is modified only slightly with respect to the first one.

The current conductor 9 represented in the measuring device in accordance with FIG. 1 can, as is to be seen from the measuring device in accordance with FIG. 2, also have a section 19 which is of hollow construction and extends virtually over the entire length of the enclosure tube 3, but is at least guided through the measuring electrode 11. Provided in the interior of the conductor section 20 of hollow construction is a sliding contact 24 on which the conductor section 20 of shorter construction is supported in an electrically conducting fashion and in such a way as to be capable of displacement in the axial direction. It is possible to dispense with the shields 21,22 owing to the rounded construction of the ends of the conductor section 19.

The measuring devices in accordance with FIGS. 1 and 2 can be installed in a gas-tight fashion (sealing rings visible but not designated in the figures) in the metal enclosure by clamping the flange 1 and the tube section 4 as well as the flange 2 and the tube section 5 with the aid of tightening bolts 25.

The outputs of the Rogovski coils 10 and the measuring electrode 11 are led to the evaluation device 23 accommodated in a bipartite metal housing via shielded measuring cables and housing bushings, of which the housing bushing for the measuring cable connected to the measuring electrode 11 is of gas-tight design. A further evaluation device 23' can be provided in a further metal housing. The evaluation device 23 can be intended predominantly for processing the output signals of the Rogovski coils 10, while the evaluation device 23' can be intended predominantly for processing the output signals of the measuring electrode 11. The output signals of the Rogovski coils 10 can, however, also be led into the evaluation device 23' and, conversely, the output signals of the measuring electrode 11 can be led into the evaluation device 23. The evaluation device 23 can also take over the tasks of the evaluation device 23', and the evaluation device 23' can take over the tasks of the evaluation device 23. The two evaluation devices 23 and 23' can also cooperate synchronously. Such a measuring device has a particularly high redundancy since, in the event of failure of one of the two evaluation devices, the evaluation device still operationally ready can carry out the further processing of the sensor output signals.

One part of the metal housing is respectively formed by a hollow metal flange 26, integrally formed on the outer surface of the enclosure tube 3, and by the region of the enclosure tube 3 bordered by the hollow flange. The other part is a housing element 27, recessed in the form of a trough, which is fastened to the hollow metal flange 26 of the enclosure tube 3 by means of its rim which bounds the trough opening. The evaluation device 23 is accommodated protected against electromagnetic and mechanical influences in this metal housing. Since long transmission paths between the sensors and the evaluation device 23 are thus eliminated, in common with interference resulting therefrom, the processing speed and the measuring accuracy can be substantially increased.

Figure 3:
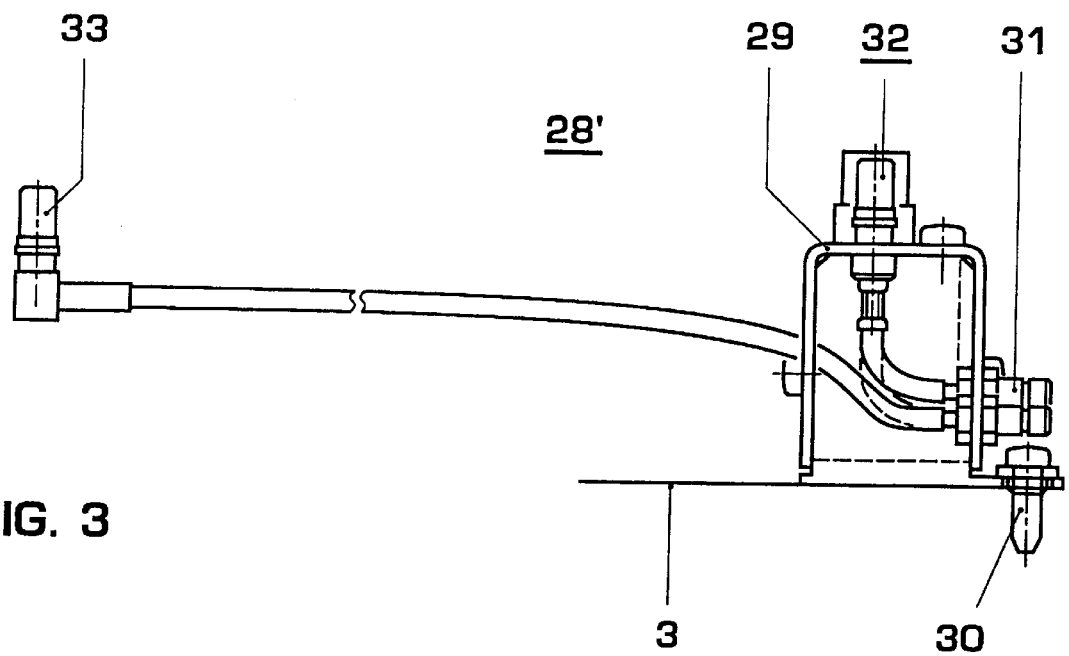
FIG. 3 shows a side view of a part, constructed as a socket connector, of a plug-and-socket device arranged in the metal housing for the purpose of connecting the outputs of the sensors to the electronic evaluation device.

The shielded measuring cables leading the output signals of the sensors into the metal housing are guided to a plug-and-socket device 28 or 28' arranged in the interior of the metal housing. The plug-and-socket device 28 or 28' has a connector part supported in a floating fashion in a plane support surface, extending transverse to the plug-in direction, of the bordered region of the enclosure tube 3. This connector part is represented in FIG. 3 for the plug-and-socket device 28'. It has a socket connector 29 which is of angular construction and has a Z-angled profile. A lower limb, guided in the plane support surface, of the Z-angle is supported in a floating fashion by means of screws 30 held on the enclosure tube. A middle limb, attached in the shape of an L, of the Z carries a coupling piece 31 which can be connected in an electrically conducting fashion to a plug-in contact of the measuring cable. The upper limb, attached to the middle limb, of the Z carries a coupling piece 32, which is connected to the coupling piece 31 and cooperates with a connector 45, to be seen in FIG. 4, of the evaluation device 23. A plug-in contact of the coupling piece 31 can be connected via a long conductor piece to a plug-in contact 33, which cooperates in the neighboring metal housing with a coupling piece arranged on the socket connector of the plug-and-socket device 28.

The middle limb of the Z can be constructed in a relatively short fashion as an alternative. The coupling piece 31 can then be attached to the underside of the upper limb of the Z and be directly connected to the coupling piece 32.

Figure 4:
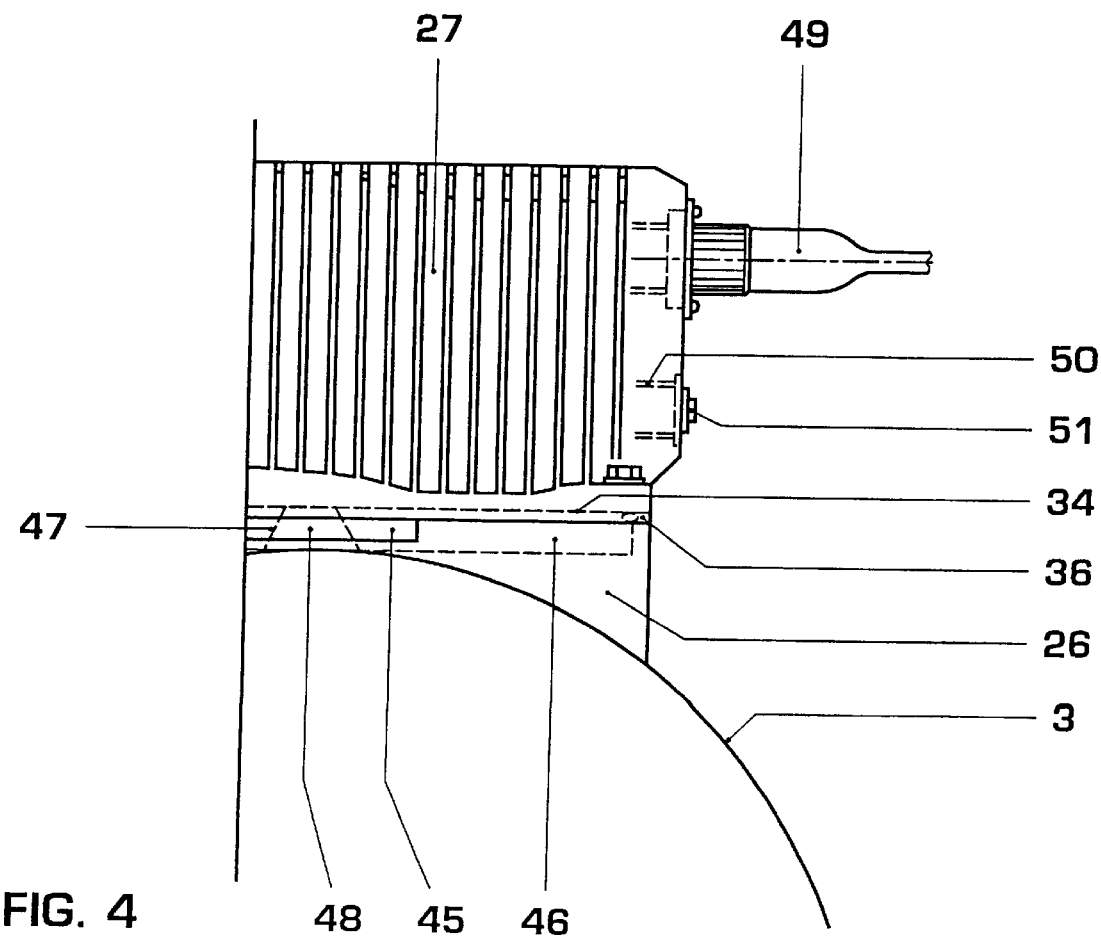
FIG. 4 shows a side view from the right of a part, containing the metal housing, of the measuring device according to FIG. 1 or 2.
Figure 5:
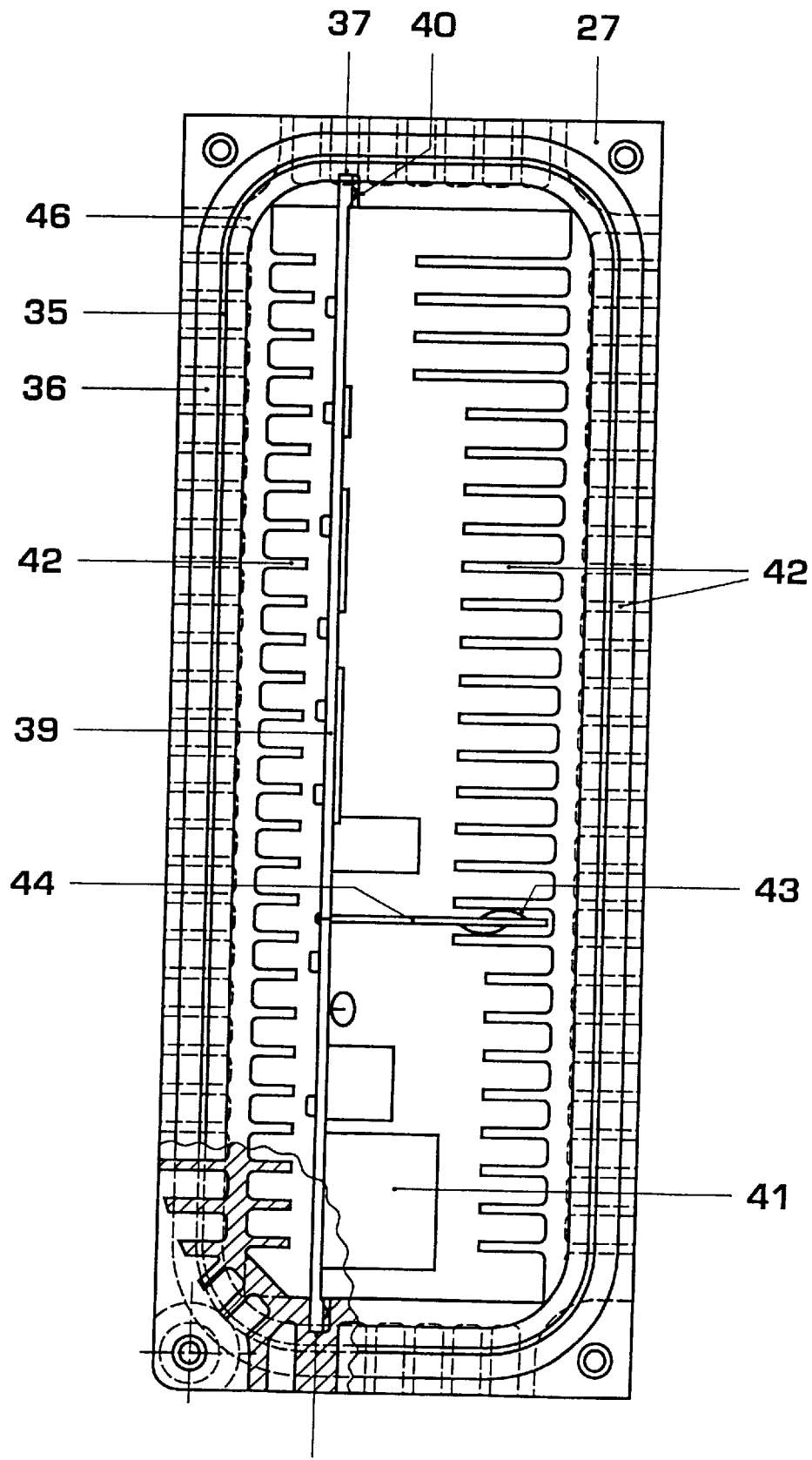
FIG. 5 shows a bottom view of a part, designed as a trough-shaped housing element, of the metal housing contained in the measuring device according to FIG. 1 or 2.

The design and the arrangement of the metal housing containing the evaluation device 23 or 23' can be seen from FIGS. 4 and 5. The hollow flange 26 has a plane contact surface 34 (FIG. 4), which is guided around the flange opening and cooperates with a plane contact surface 35, guided around the trough opening, of the trough rim (FIG. 5) accompanied by the formation of an electrical connection. The two parts of the metal housing, which are essentially formed by the hollow flange 26 and the housing element 27, are thus connected to one another in an electrically conducting fashion and form a Faraday cage for the evaluation device. The two annularly closed contact surfaces are surrounded by at least one O-ring 36 clamped between the hollow flange 26 and the trough rim. The result is a virtually gas-tight connection of the two housing parts, and, at the same time, the two contact surfaces 34 and 35 are protected against pollutants arriving from outside.

At least one groove 37 and 38, respectively, extending from the trough rim in the direction of the trough floor is formed in each case on mutually opposite inner surfaces of the housing element 27 (FIG. 5). This groove serves to receive an edge of a printed circuit board 39 of the evaluation device which can be connected in an electrically conducting fashion to one or more plug-in contacts of the plug-and-socket device 28 or 28'. The groove 37 or 38 is designed to be oversized and receives contact springs 40 which are additionally attached to the rim of the printed circuit board 39. Conductor tracks, connected to the contact springs, of the printed circuit board 39 are thus led to the potential of the metal housing. Electronic components located on the printed circuit board 39 and having a coating 41 which is electrically connected to the contact springs 40 are thus electromagnetically shielded.

Cooling ribs 42 are formed in the trough-shaped housing element 27 on the inside and/or outside. The inner cooling ribs absorb heat from the electronic components. This heat is conducted outwards and dissipated to the surroundings from the outer cooling ribs.

The inner cooling ribs can fulfill additional tasks. As is to be seen from FIG. 5, it is possible to arrange between two cooling ribs 42 arranged adjacent to one another a rim and contact springs 43 of an electromagnetic shield 44 of the evaluation device which is constructed in the shape of a plate and arranged between two electronic components. This shield 44 acts as an electromagnetic barrier between the neighboring electronic components.

The trough opening is closed by means of an electromagnetically shielding cover plate as well as by means of the connector 45, which is guided through an opening in the cover plate and carries plug-in contacts which cooperate with the coupling piece 32. The housing element 27 has a collar 46 which projects beyond the trough rim and is guided through the opening in the hollow flange 26. The collar 46 also projects beyond the connector 45 and has a material cutout 48 which cooperates with a projection 47 of the hollow flange 26 (FIG. 4).

The collar 46 fulfills the following functions: during mounting of the measuring device it guides the housing element 27 into the hollow flange 26. In this case, the projection 47, which cooperates as coding with the material cutout 48, ensures that the housing element 27 and thus the connector 45 is inserted into the coupling piece 32 in the correct position. This prevents the output signal of one of the Rogovski coils 11, for example, from being led through a false plug-and-socket connection to an electronic component of the evaluation device which is unsuitable for processing it. Since the collar 46 projects beyond the connector 45, when the connector 45 is assembled it cannot come into contact with a part of the hollow flange and thereby be damaged.

It is advantageous during assembly that the socket connector 29 is supported in a floating fashion. Positional errors in the coupling piece 32 and the connector 45, which cannot be avoided, can thus be compensated in a particularly simple way.

As may be seen from FIG. 4, there is attached to the housing element 27 a connector 49 which cooperates with a coupling piece which is guided through the wall of the housing element 27 and is connected to the evaluation device 23 or 23'. Through the plug-and-socket connection thus formed, the evaluation device 23 or 23' communicates, preferably via interference-free optical fibers, with a higher-level control system, and the evaluation device 23 or 23' is simultaneously supplied with electrical energy via a wired connection. The communication chiefly comprises transmitting digitized measured values, for example of current, voltage, temperature, pressure or density, to the control system, but can also serve the purpose of transmitting information formed in the control system to the evaluation unit 23 or 23'.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A measuring device for a metal-enclosed, gas-insulated high-voltage installation having at least one Rogovski coil, which is arranged in an enclosure tube, filled with insulating gas, of the metal enclosure and serves to detect the current in a current-carrying conductor led through the enclosure tube, having at least one measuring electrode, which surrounds the conductor and serves to detect the voltage of the conductor, and having at least one electronic evaluation device, which processes output signals of the Rogovski coil and the measuring electrode, wherein the current conductor is rigidly connected to a current-conducting cast armature of an insulator fastened to the enclosure tube.

2. The measuring device as claimed in claim 1, wherein the current conductor is constructed in at least two parts, a first part of the current conductor being fastened to the cast armature with the aid of screws which are guided in the direction of the tub axis.

3. The measuring device as claimed in claimed in claim 2, wherein the first part is of hollow construction and has in its interior at least one sliding contact, on which the second part is supported in an electrically conducting fashion and displaceably in the direction of the but axis.

4. The measuring device as claimed in claim 1, wherein on the current conductor additionally provided shields are rigidly screwed to the conductor.

5. The measuring device as claimed in claim 1, wherein the insulator is fixed on the enclosure tube by means of screws with the aid of a holding ring guided axially against the insulator.

6. The measuring device as claimed in claim 2, wherein the screws are protected against unauthorized operation with the aid of a seal.

7. The measuring device as claimed in claim 1, wherein characteristics and calibration data of sensors containing the Rogovski coil and the measuring electrode are stored in a read-only data memory which can be called by the evaluation device.

8. The measuring device as claimed in claim 7, wherein the data memory is arranged in the interior of the metal housing protected against unauthorized operation by a seal.

9. The measuring device as claimed in claim 1, wherein there is provided in addition to the at least one evaluation device at least one further evaluation device, which in the event of a failure of the at least one evaluation device takes over its tasks.

10. The measuring device as claimed in claim 1, wherein the evaluation device is arranged in a bipartite metal housing which is of dustproof construction and whose one part is formed by a hollow metal flange, integrally formed on the outer surface of the enclosure tube, and the region of the enclosure tube bordered by the hollow flange, and whose other part is a housing element, recessed in the form of a trough, which is fastened with its rim, bounding the trough opening, to the hollow metal flange of the enclosure tube.

* * * * *